United States Patent [19]
Lau et al.

[11] 4,047,241
[45] Sept. 6, 1977

[54] CAPACITIVE SWITCH

[75] Inventors: Edward H. Lau, Old Westbury; Francis C. Marino, Dix Hills, both of N.Y.

[73] Assignee: Burroughs Corporation, Detroit, Mich.

[21] Appl. No.: 676,122

[22] Filed: Apr. 12, 1976

[51] Int. Cl.² .................................................. H01G 5/01
[52] U.S. Cl. .............................. 361/288; 200/DIG. 1; 340/365 C
[58] Field of Search ............... 317/249 R, 249 PB; 200/DIG. 1; 340/365 C; 361/288

[56] References Cited

U.S. PATENT DOCUMENTS

| | | | |
|---|---|---|---|
| 3,676,607 | 7/1972 | Nash | 340/365 C |
| 3,693,059 | 9/1972 | Harris | 317/249 PB |
| 3,710,209 | 1/1973 | Webb | 200/DIG. 1 |
| 3,823,355 | 7/1974 | Batz | 317/249 PB |
| 3,965,399 | 6/1976 | Walker | 317/249 R |

Primary Examiner—E. A. Goldberg
Attorney, Agent, or Firm—Hane, Sullivan & Spiecens

[57] ABSTRACT

A capacitive switch includes: an electrical circuit formed by two spaced pads of conductive material on an insulative substrate; and a capacitive coupling member on the end of a keystem wherein the end of the keystem has a looped ribbon formed by two layers of insulating material sandwiching a layer of conductive material. As the keystem is urged toward the substrate a monotonically increasing area of the ribbon mechanically contacts the pads so that a monotonically increasing capacitive coupling is made between the two spaced pads.

5 Claims, 8 Drawing Figures

CAPACITIVE SWITCH

BACKGROUND OF THE INVENTION

The invention pertains to electrical switches and more particularly to such switches utilizing capacitive coupling.

Electrical switches can be used for many control and selection functions. One such widely used function is in keyboard devices such as typewriters, telephone handsets and calculators. The keyboards of such devices, since they control electronic signals, try to avoid the use of mechanical contact switches because of their complexity, unreliability of bounce and cost. Thus, these keyboards utilize a variety of transducers to perform the switching operation. People have tried to use magnetically operated reed switches, Hall effect devices, photo-electronic devices and capacitive techniques. In order to improve the reliability of the operation of the keyboard, each key switch has a simple compression spring to provide a key switch restoring force. Some recent keyboard designs eliminate the use of compression springs by relying on magnetic restoring forces effected by the interactions of fixed and movable magnets. Some of these magnetic techniques simply and reliably simulate the feel of the special and complicated "over-center" and/or other special "tripping" mechanisms of some keyboards.

However, all of these electronic keyboards have less mechanical hysteresis than conventional "over-center" key switches.

Mechanical hysteresis is the phenomenom which occurs when a key is depressed and an electrical signal is generaged at a first point during the downward travel of the key. This signal cannot be generated again until the key is released and travels a certain distance to a second point above the first point and then travels downward again past the first point. The distance between the first and second points is the mechanical hysteresis. However, it is usually expressed as percentage of total key travel. For example, if the spacing between the first and second points is 0.010 inch and the total possible key travel is 0.20 inch then the key is said to have 5% mechanical hysteresis.

It has been found that capacitive switch devices wherein the key acts as a coupling element between two coplanar pads have one of the smallest mechanical hysteresis phenomena. The reason is that practically all of the useful signal coupling occurs during the last 5 to 15 percent of the total travel of the key and during this range the coupling changes sharply. What is desired is that the useful signal coupling occur over a much broader range and that the change be less sharp. In this way one can sensitize the electrical reading circuits to discriminate between two levels of signal coupling at two more distant points in the travel.

In spite of this poor mechanical hysteresis property of conventional "capacitive keyboards," they afford the greatest economy of manufacture since they rely on the positions of conductive elements that are easily printed on substrates. Therefore, it is highly desirable to utilize a capacitive keyboard.

SUMMARY OF THE INVENTION

It is, accordingly, a general object of the invention to provide an improved capacitive switch.

It is another object of the invention to provide such a switch which is more reliable than presently available capacitive switches.

It is a further object of the invention to provide an inexpensive capacitive switch which can afford at least twice the mechanical hysteresis of conventional capacitive switches.

In general, the invention amplitude-modulates AC signals by applying an AC signal to one of a pair of planar conductors spaced from each other, controllably changing the area of mechanical contact between a further conductor and the pair of planar conductors by resiliently deforming the further conductor, and transmitting the amplitude modulated AC signal from the other of the pair of planar conductors.

More particularly, the invention contemplates a capacitive switch comprising an electrical circuit having first and second spaced pads of conductive material on a substrate of insulative material and capacitive coupling member for controllably capacitively coupling the first pad to the second pad. The capacitive coupling member includes a keystem positioned opposite the pads and having a transverse portion extending so as to span the pads but displaced from the pads when in a retracted position. The ends of a ribbon of resilient conductive material are fixed to opposite ends of the transverse portion. The ribbon has a length so that the ribbon is bowed toward the pads but spaced therefrom when the switch stem is in the retracted position. Thus, as the switch stem is moved forward the ribbon first mechanically contacts the pad-substrate combination and the area of mechanical contact monotonically increases. If the contacting surface of the ribbon is insulated then as the contact area increases so does the capacitive coupling.

BRIEF DESCRIPTION OF THE DRAWING

Other objects, the features and advantages of the invention will be apparent from the following detailed description when read with the accompanying drawing wherein:

In FIG. 1 the capacitive switch is shown having an electrical circuit including a substrate 10 of insulative material upon which are "printed" pads 12 and 14 of conductive material. The top or exposed surfaces of the pads are conductive surfaces. The pads are spaced from each other by a gap 16. In addition, the pad 12 is connected via a signal terminal 18 to a source of AC signal SS and the pad 14 is connected via a signal terminal 20 to a signal utilization device SU.

Normally an AC signal is fed to terminal 18 from source SS and is sensed for at terminal 20 by device SU. The AC signal is preferably in the form of pulses. The passage of the signal from terminal 18 and pad 12 to pad 14 and terminal 20 is controlled by a capacitive coupling member.

Figure 2:
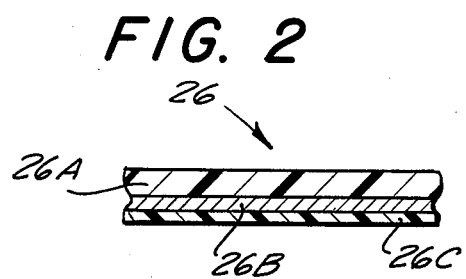
FIG. 2 is a cross sectional view of the ribbon used in the switch of FIG. 1.

The capacitive coupling member includes a switch stem 22 having a transverse portion 24 at an end opposite the pads 12 and 14. Fixed to the ends of portion 24 is a ribbon 26. The ribbon as shown in FIG. 2 has a substrate 26A or backing of resilient plastic material such as MYLAR on which has been deposited a layer of metallic material 26B such as aluminum or silver. The metallic material is then covered with a coating of insulating material 26C. The member can be positioned opposite the pads by means of support 28 through which passes switch stem 22. If the switch is to be finger operated, when it is one key of a keyboard, the top end of the stem is provided with a key cap 30. Normally, the keystem is held in the retracted position as shown. One can use a spring such as compression spring 32 or the above mentioned interacting magnets.

In addition, there can be provided a bumper 31 of elastic material which acts as a stop for downward travel of the switch stem 22.

Figure 1:
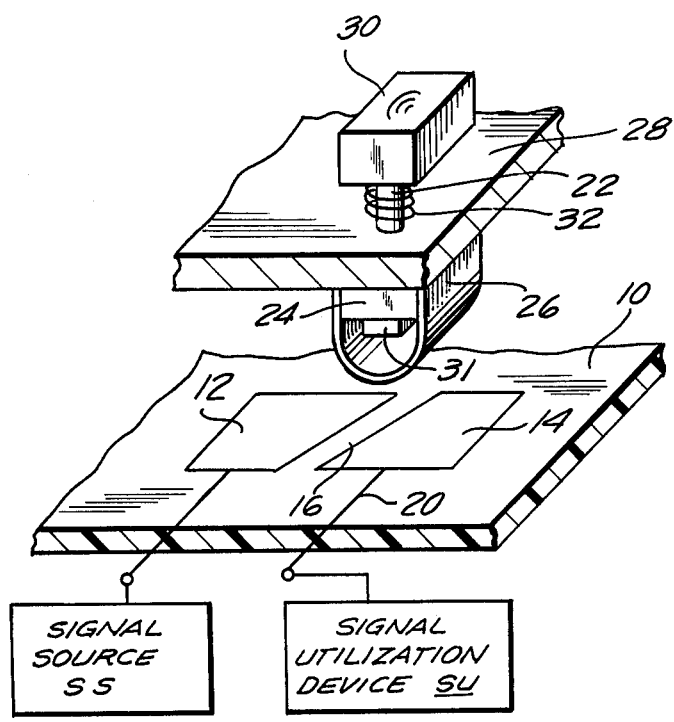
FIG. 1 is a perspective view of a capacitive switch in accordance with the invention.
Figure 1A:
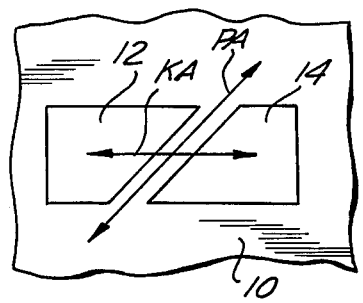
FIG. 1A is a plan view of the pads for the electrical circuit of the capacitive switch.

As seen in FIG. 1A, the major or longitudinal axis KA of the ribbon 26 make an acute angle with the axis PA of the gap 16. If these axes were parallel then one would obtain capacitive changes for the maximum amount of travel of the stem 22. However, such alignment also have maximum strap capacitance. If the axes are orthogonal then there would be a minimum stray capacitance but a smaller percentage of the total stem travel would be associated with capacitance changes. Therefore, an orientation between parallelism and orthogonality is preferred.

Figure 4:
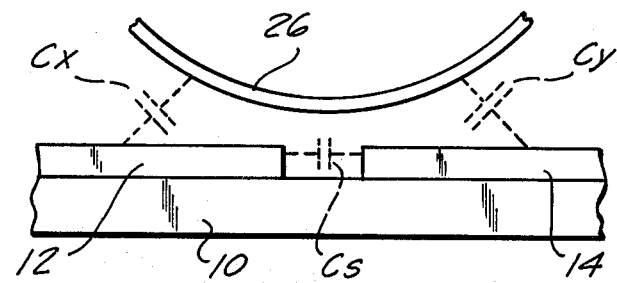
FIG. 4 is a schematic representation of the capacitances associated with the switch of FIG. 1.

The transfer of signal from pad 12 to pad 14 depends on the capacitance CK coupling the pads. As shown in FIG. 4 this capacitance has three major components, the capacitance Cs which is the unavoidable stray capacitance always coupling the pads and arising from the layout on the substrate, the variable capacitance Cx which couples pad 12 to ribbon 26 and the variable capacitance Cy which couples pad 14 to ribbon 26. (The variable capacitances are functions of the position of ribbon 26 with respect to the pads.) It can be shown that the capacitance between the pads follows the equation:

$$Ck = (Cx \cdot Cy / - Cx + Cy) + CS$$

Figure 5:
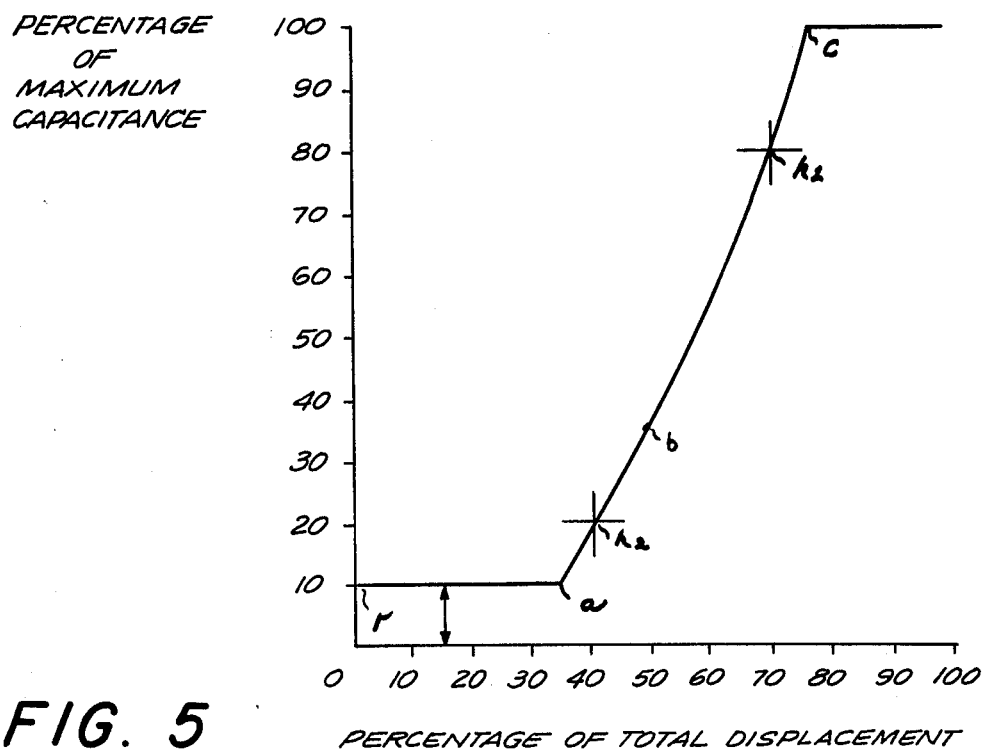
FIG. 5 is an idealized waveform showing the capacitance-displacement characteristic of the switch of FIG. 1.
Figure 3A:
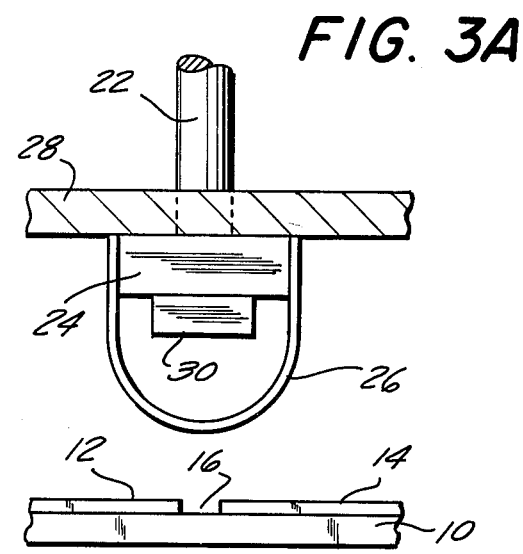
FIGS. 3A, 3B and 3C are cross sectional views of the switch of FIG. 1 during three different travel distances of the switch.
Figures 3B, 3C:
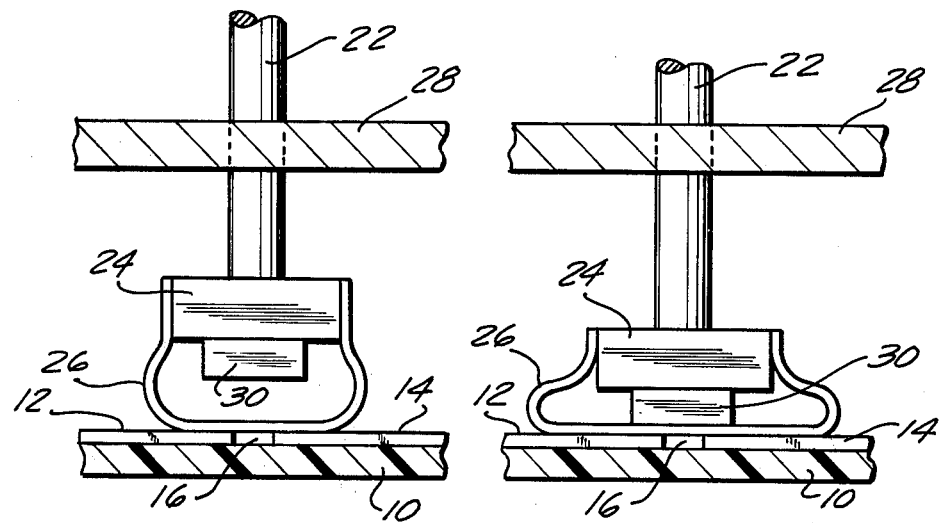

The operation of the switch will now be described primarily with the aid of FIGS. 3 and 5. Initially the switch is in its rest position as shown in FIG. 3A. At this time, the only coupling capacitance is the stray capacitance Cs. This is shown as point $r$ of curve of FIG. 5 wherein the stray capacitance is shown as 10% of the maximum capacitance. Any capacitance Cx and Cy is negligible at this time. As the stem 22 is depressed point $a$ is reached at about the one-third distance in total possible travel wherein the ribbon 26 just contacts the pads. Thereafter, further depression resiliently deforms the ribbon, increasing the coupling between the pads and the ribbon. For example, FIG. 3B shows point $b$ where travel is about 50% of total. Finally, further depression of the key results in further increase of coupling capacitance until maximum capacitance is reached at poine $c$ when ribbon 26 completely overlies the pads as shown in FIG. 3C. Further travel is possible by compressing buffer 30 however, there is only an inconsequential increase in capacitance.

Now, if one assumes there is a linear relationship between signal transfer and coupling capacitance and one assumes that the utilization device SU establishes the hysterisis criteria as 80% of maximum signal for "make" and 20% of the maximum signal for "break," then it is seen that the make occurs at point $h_1$ equal to the 70% travel point and the break occurs at point $h_2$ or the 40% travel point. Thus the mechanical hysterisis is 30% of total travel.

In conclusion, there has been shown a capacitive switch which provides a monotonically increasing capacitance between pads printed on a substrate starting relatively early in the stem travel and continuing throughout virtually all of the remainder of the travel. This has been accomplished by using an insulated conductor in the form of a flexible loop of ribbon fixed to the end of the stem opposite the pads. The increasing capacitance is effected by a non-electrical, mechanical contact of the loop of ribbon with the pads such that the capacitance increases with the increasing area of contact between the loop and the pads as the downward travel of the stem progresses.

While only a single embodiment of the invention has been shown and described in detail there will now be obvious to those skilled in the art many modifications and variations satisfying many or all of the objects while not departing from the spirit of the invention as defined by the appended claims.

What is claimed is:

1. A capacitive switch comprising: an electrical circuit, said circuit having a substrate of insulative material, first and second pads of conductive material on a surface said substrate, each of said pads having a terminal adapted to transfer electrical signals, said pads being separated by a region of the surface of said substrate and having coupling surfaces remote from said substrate; and a capacitive coupling member, said member having a switch stem positioned opposite said pads and said region, said stem including a transverse portion extending so as to span said pads but displaced therefrom, a ribbon of resilient conductive material having ends fixed to respective ends of said transverse portion and having such a length that the ribbon is bowed toward said pads, said ribbon comprising a substrate of resilient plastic material, a layer of metallic material deposited on one surface of said substrate of resilient plastic material, and a coating of insulative material on said layer of metallic material, a buffer layer of elastic material on the face of said transverse portion opposite the bowed portion of said ribbon, and means for guiding said switch for reciprocating movement in the direction of said substrate so that as said switch stem 2. moves toward said substrate a monotonically increasing area of said ribbon mechanically contacts said pads. A capacitive switch comprising: an electrical circuit, said circuit having a substrate of insulative material, first and second pads of conductive material on a surface said substrate, each of said pads having a terminal adapted to transfer electrical signals, said pads being separated by a region of the surface of said substrate and having coupling surfaces remote from said substrate; and a capacitive coupling member, said member having a switch stem positioned opposite said pads and said region, one end of said stem including a transverse portion extending so as to span said pads but displaced therefrom, a ribbon of material having ends fixed to respective ends of said transverse portion and having such a length that the ribbon is bowed toward said pads, said ribbon comprising a substrate of resilient plastic material, a layer of metallic material deposited on one surface of said substrate of resilient plastic material, and a coating of insulative material on said layer of metallic material, a key cap fixed to the end of said switch stem remote from transverse portion so that the capacitive switch is operable by the finger of a user, and means for guiding said switch for reciprocating movement in the direction of said substrate so that as said switch stem moves toward said substrate a monotonically increasing area of said ribbon mechanically contacts said pads.

3. the capacitive switch of claim 2 wherein the coating of insulative material on the layer of metallic material of said ribbon makes mechanical contact with said pads.

4. The capacitive switch of claim 3 wherein the exposed surfaces of said pads are bare.

5. The capacitive switch of claim 2 wherein the longitudinal axis of the ribbon and the axis of the gap between the pads makes an acute angle.

* * * * *